(12) United States Patent
Nakashima et al.

(10) Patent No.: US 11,880,213 B2
(45) Date of Patent: Jan. 23, 2024

(54) SUBSTRATE LIQUID PROCESSING APPARATUS AND SUBSTRATE LIQUID PROCESSING METHOD

(71) Applicant: Tokyo Electron Limited, Tokyo (JP)

(72) Inventors: Mikio Nakashima, Koshi (JP); Akinori Tanaka, Koshi (JP); Nobuhiro Ogata, Koshi (JP); Isamu Miyamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 362 days.

(21) Appl. No.: 17/320,733

(22) Filed: May 14, 2021

(65) Prior Publication Data

US 2021/0365054 A1 Nov. 25, 2021

(30) Foreign Application Priority Data

May 19, 2020 (JP) .................................. 2020-087525

(51) Int. Cl.
*G05D 7/06* (2006.01)
*H01L 21/67* (2006.01)
(Continued)

(52) U.S. Cl.
CPC ........ *G05D 7/0635* (2013.01); *B05C 11/1026* (2013.01); *H01L 21/6708* (2013.01);
(Continued)

(58) Field of Classification Search
CPC .............. G01M 3/38; H01L 21/67023; H01L 21/67253; H01L 21/6708; B65C 11/08;
(Continued)

(56) References Cited

U.S. PATENT DOCUMENTS 249,285 A * 11/1881 Allen .................. F04B 43/1223
417/477.14
2015/0004720 A1 * 1/2015 Liu .................. H01L 21/02137
118/712
(Continued)

FOREIGN PATENT DOCUMENTS

JP 6059087 B2 12/2014
WO WO-2019009054 A1 * 1/2019 ........... H01L 21/304

OTHER PUBLICATIONS

Translation of WO-2019009054, Jan. 2019.*

*Primary Examiner* — William M McCalister
(74) *Attorney, Agent, or Firm* — Armstrong Teasdale LLP

(57) ABSTRACT

A substrate liquid processing apparatus includes: at least one liquid pipe through which a processing liquid flows; a discharge nozzle configured to discharge the processing liquid supplied via the at least one liquid pipe; a valve mechanism configured to regulate a flow of the processing liquid in the at least one liquid pipe; and a liquid detection sensor configured to detect presence or absence of the processing liquid in the at least one liquid pipe, wherein in a state in which the valve mechanism is operating so that the processing liquid in the at least one liquid pipe is located at an upstream of a first pipe measurement site of the at least one liquid pipe, the liquid detection sensor detects the presence or absence of the processing liquid at the first pipe measurement site located at a first measurement point.

10 Claims, 12 Drawing Sheets

(51) Int. Cl.
*B05C 11/10* (2006.01)
*G01M 3/38* (2006.01)
*G01F 1/661* (2022.01)

(52) U.S. Cl.
CPC .. *H01L 21/67023* (2013.01); *H01L 21/67253* (2013.01); *G01F 1/661* (2013.01); *G01M 3/38* (2013.01)

(58) Field of Classification Search
CPC ............... B65C 11/1026; G01F 1/661; Y10T 137/7761; G05D 7/0635; B05C 11/026
USPC ...................................................... 137/487.5
See application file for complete search history.

(56) References Cited

U.S. PATENT DOCUMENTS

| | | | |
|---|---|---|---|
| 2016/0055649 A1* | 2/2016 | Peret ................... | F16M 13/022 348/135 |
| 2018/0090306 A1* | 3/2018 | Higashijima ..... | H01L 21/67051 |
| 2018/0236510 A1* | 8/2018 | Osada ............... | H01L 21/67253 |
| 2020/0070196 A1* | 3/2020 | Kamimura .............. | B05B 14/00 |

* cited by examiner

SUBSTRATE LIQUID PROCESSING APPARATUS AND SUBSTRATE LIQUID PROCESSING METHOD

CROSS-REFERENCE TO RELATED APPLICATION

This application is based upon and claims the benefit of priority from Japanese Patent Application No. 2020-087525, filed on May 19, 2020, the entire contents of which are incorporated herein by reference.

TECHNICAL FIELD

The present disclosure relates to a substrate liquid processing apparatus and a substrate liquid processing method.

BACKGROUND

Patent Document 1 discloses an apparatus in which a flow rate of a processing liquid flowing through a supply path is measured based on a response time, and when the measured value of the flow rate exceeds a threshold value, it is determined that leak of the processing liquid has occurred in a valve provided in the supply path.

PRIOR ART DOCUMENTS

Patent Documents

Patent Document 1: Japanese laid-open publication No. 6059087

SUMMARY

According to one embodiment of the present disclosure, there is provided a substrate liquid processing apparatus includes: at least one liquid pipe through which a processing liquid flows; a discharge nozzle configured to discharge the processing liquid supplied via the at least one liquid pipe; a valve mechanism configured to regulate a flow of the processing liquid in the at least one liquid pipe; and a liquid detection sensor configured to detect presence or absence of the processing liquid in the at least one liquid pipe, wherein in a state in which the valve mechanism is operating so that the processing liquid in the at least one liquid pipe is located at an upstream of a first pipe measurement site of the at least one liquid pipe, the liquid detection sensor detects the presence or absence of the processing liquid at the first pipe measurement site located at a first measurement point.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
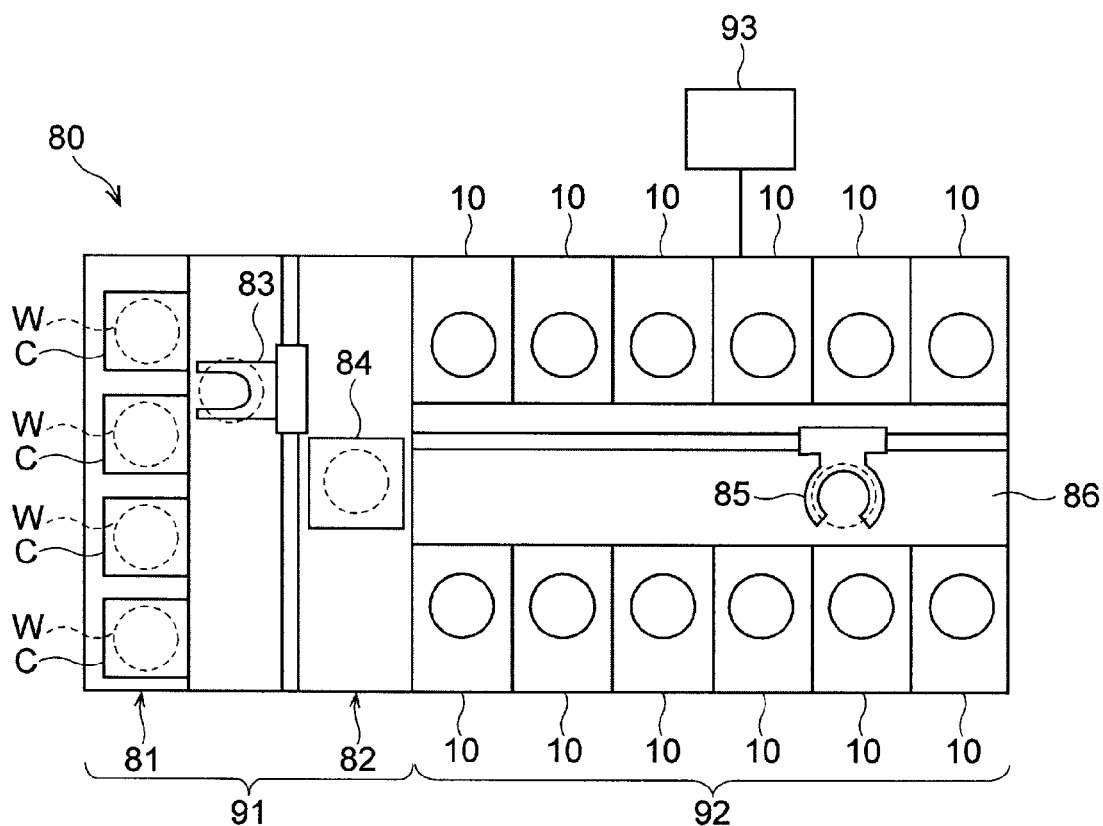
FIG. 1 is a view schematically showing an example of a processing system.

FIG. 1 is a diagram schematically showing an example of a processing system 80. The processing system 80 shown in FIG. 1 includes a loading/unloading station 91 and a processing station 92. The loading/unloading station 91 includes a stage 81 having a plurality of carriers C placed thereon, and a transfer part 82 including a first transfer mechanism 83 and a delivery part 84. A plurality of substrates W are accommodated in a horizontal posture in each carrier C. The processing station 92 includes a plurality of processing units 10 arranged at both sides of a transfer path 86, and a second transfer mechanism 85 that reciprocates along the transfer path 86.

The substrate W is taken out from the carrier C by the first transfer mechanism 83, is placed on the delivery part 84, and is taken out from the delivery part 84 by the second transfer mechanism 85. Then, the substrate W is loaded into a corresponding processing unit 10 by the second transfer mechanism 85 and is subjected to a predetermined liquid processing (for example, chemical liquid processing) in the corresponding processing unit 10. Thereafter, the substrate W is taken out from the corresponding processing unit 10 by the second transfer mechanism 85, is placed on the delivery part 84, and then is returned to the carrier C of the stage 81 by the first transfer mechanism 83.

The processing system 80 includes a controller 93. The controller 93 is composed of, for example, a computer, and includes an operation processing part and a storage part. Programs and data for various processes performed by the processing system 80 are stored in the storage part of the controller 93. The operation processing part of the controller 93 controls various devices of the processing system 80 to perform various processes by appropriately reading and executing the programs stored in the storage part.

The programs and data stored in the storage part of the controller 93, which were recorded in a non-transitory computer-readable storage medium, may be installed in the storage part from the storage medium. Examples of the computer-readable storage medium may include a hard disk (HD), a flexible disk (FD), a compact disc (CD), a magneto-optical disc (MO), a memory card and the like.

Figure 2:
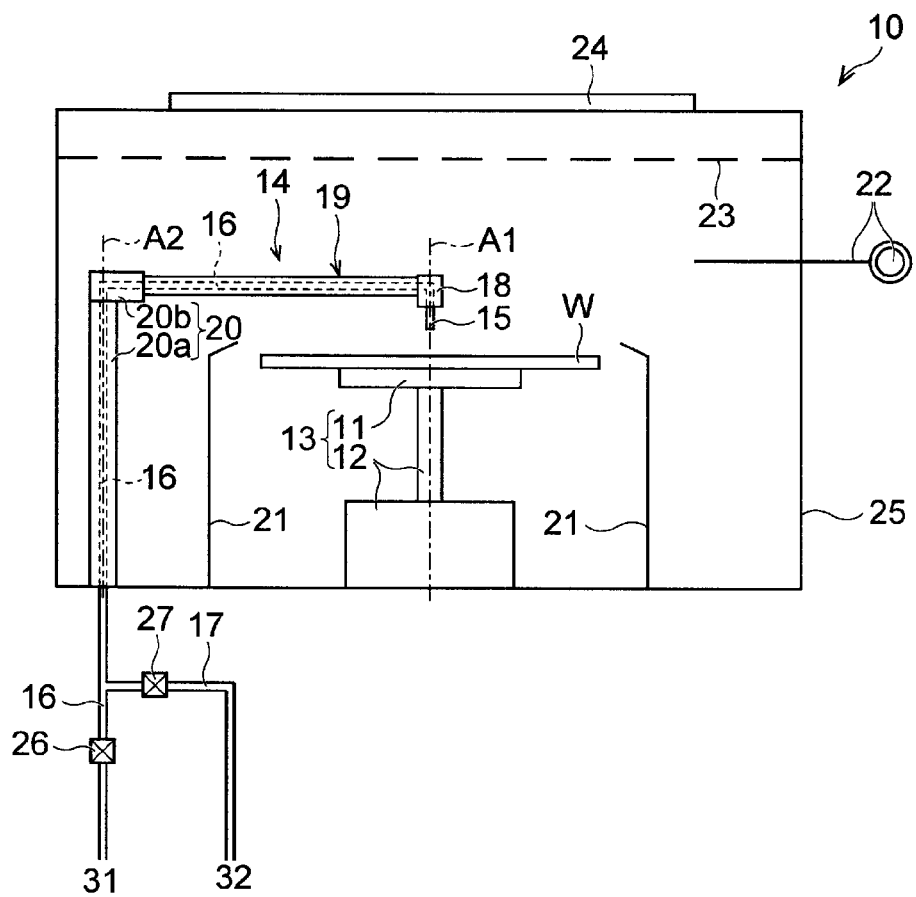
FIG. 2 is a view schematically showing an example of a processing unit.

FIG. 2 is a view schematically showing an example of the processing unit 10.

The processing unit 10 constitutes a substrate liquid processing apparatus that supplies a processing liquid to the substrate W to perform the liquid processing on the substrate W, together with the controller 93 (see FIG. 1). A specific composition and application of the processing liquid are not particularly limited. For example, a chemical liquid, pure water, and a cleaning liquid may be used as the processing liquid.

The processing unit 10 of the present embodiment includes a substrate holder 11, a rotation drive part 12, a liquid supplier 14, a cup structure 21, an inert gas supplier 22, a rectifying plate 23, a FFU (Fan Filter Unit) 24, and a processing chamber 25. The substrate holder 11, the rotation drive part 12, at least a portion of the liquid supplier 14, the cup structure 21, and the rectifying plate 23 are provided inside the processing chamber 25. At least a portion of the inert gas supplier 22 and the FFU 24 is provided outside the processing chamber 25.

The substrate holder 11 holds the substrate W supplied via the second transfer mechanism 85 (see FIG. 1). The substrate holder 11 shown in FIG. 2 adopts a vacuum manner of attracting and holding a rear surface of the substrate W, but the substrate holder 11 may hold the substrate W by another manner (for example, a mechanical chuck manner). The rotation drive part 12 applies rotational power to the substrate holder 11 to rotate the substrate W held by the substrate holder 11, together with the substrate holder 11. The rotation drive part 12 shown in FIG. 2 includes a rotation drive shaft extending on a rotation axial line A1 and having a lead end portion to which the substrate holder 11 is fixedly attached, and a rotation drive main body that rotates the rotation drive shaft around the rotation axial line A1. In this way, at least a portion of a rotation mechanism 13 that rotates the substrate W around the rotation axial line A1 is constituted by the substrate holder 11 and the rotation drive part 12.

The cup structure 21 has a ring-like planar shape and is provided so as to surround the substrate W held by the substrate holder 11. The cup structure 21 receives liquid scattered from the substrate W and guides the same to a drain duct (not shown), or arranges a flow of gas so as to prevent the gas around the substrate W from diffusing. A specific configuration of the cup structure 21 is not particularly limited. For example, the cup structure 21 may include a cup mainly for guiding the liquid and a cup mainly for arranging the flow of gas, as separate bodies.

The inert gas supplier 22 supplies an inert gas (for example, nitrogen) into the processing chamber 25. The FFU 24 creates a down-flow air flow inside the processing chamber 25. The rectifying plate 23 has a large number of holes (see through-holes (reference numeral "23a" in FIG. 4) to be described later) and is provided directly under a blow-off port of the FFU 24 to rectify the air flow and optimize the flow of a down-flow gas inside the processing chamber 25.

The liquid supplier 14 includes a supply line 16 connected to a processing liquid source 31, and a discharge nozzle 15 connected to the supply line 16. A processing liquid from the processing liquid source 31 is allowed to flow through the supply line 16. The discharge nozzle 15 discharges the processing liquid supplied via the supply line 16.

A discharge head 18, a rocking arm 19, and a rocking device 20 are provided inside the processing chamber 25. The discharge nozzle 15 is attached to the discharge head 18. The discharge head 18 is attached to one end portion of the rocking arm 19, and the rocking device 20 is attached to the other end portion of the rocking arm 19. The rocking device 20 includes a swiveling drive shaft 20a extending on a swiveling axial line A2, and a swiveling body portion 20b fixed to an upper end portion of the swiveling drive shaft 20a and the rocking arm 19, and swivels around the swiveling axial line A2. The discharge nozzle 15, the discharge head 18, and the rocking arm 19 swing around the swiveling axial line A2 according to the swiveling operation of the rocking device 20.

The supply line 16 extends outside and inside the processing chamber 25. The supply line 16 is provided inside the processing chamber 25 so as to penetrate each of the rocking device 20, the rocking arm 19, and the discharge head 18, and is connected to the discharge nozzle 15. Outside the processing chamber 25, one end portion of a drain line 17 is connected to the supply line 16. A drain part 32 is connected to the other end portion of the drain line 17, and a processing liquid flowing from the supply line 16 into the drain line 17 is sent to the drain part 32. In this way, in the present embodiment, a liquid pipe through which the processing liquid flows includes the supply line 16 and the drain line 17.

A valve mechanism that regulates a flow of the processing liquid in the liquid pipe includes a supply opening/closing valve 26 and a drain opening/closing valve 27. That is, the supply opening/closing valve 26 is attached to the supply line 16, and the drain opening/closing valve 27 is attached to the drain line 17. The supply opening/closing valve 26 regulates the flow of the processing liquid in the supply line 16, and the drain opening/closing valve 27 regulates the flow of the processing liquid in the drain line 17. Specifically, the supply opening/closing valve 26 is opened to open the supply line 16, and the supply opening/closing valve 26 is closed to close the supply line 16. Further, the drain opening/closing valve 27 is opened to open the drain line 17, and the drain opening/closing valve 27 is closed to close the drain line 17.

In the example shown with reference to the figure, the drain line 17 branches from a portion of the supply line 16 located outside the processing chamber 25 and is provided at a position lower than that of each of the discharge nozzle 15, the discharge head 18, the rocking arm 19, and the rocking device 20. The supply opening/closing valve 26 and the drain opening/closing valve 27 are provided outside the processing chamber 25. In particular, the supply opening/closing valve 26 is provided at the upstream of a portion of the supply line 16 from which the drain line 17 branches. Therefore, based on the principle of siphon, by opening the drain opening/closing valve 27, the processing liquid in the supply line 16 (particularly on the downstream side of the portion from which the drain line 17 branches) flows into the drain line 17 and flows toward the drain part 32. Therefore, the position (particularly the position of the most downstream) of the processing liquid in the supply line 16 (particularly on the downstream side of the portion from which the drain line 17 branches) may be changed by adjusting the opening/closing of the drain opening/closing valve 27 in a state in which the supply line 16 is closed by the supply opening/closing valve 26. In particular, the drain opening/closing valve 27 of the present embodiment operates to open the drain line 17 to allow the processing liquid to flow from the supply line 16 to the drain line 17, in order to locate the processing liquid in the supply line 16 at the upstream of a first pipe measurement site (see reference numeral "R1" in FIG. 4), as will be described later.

The terms "upstream" and "downstream" used therein are based on the flow of liquid during normal operation unless otherwise specified. For example, with respect to the supply line 16, unless otherwise specified, a side closer to the processing liquid source 31 is the "upstream side," and a side closer to the discharge nozzle 15 is the "downstream side." With respect to the drain line 17, unless otherwise specified, a side closer to a portion connected to the supply line 16 is the "upstream side," and a side closer to the drain part 32 is the "downstream side."

Figure 3:
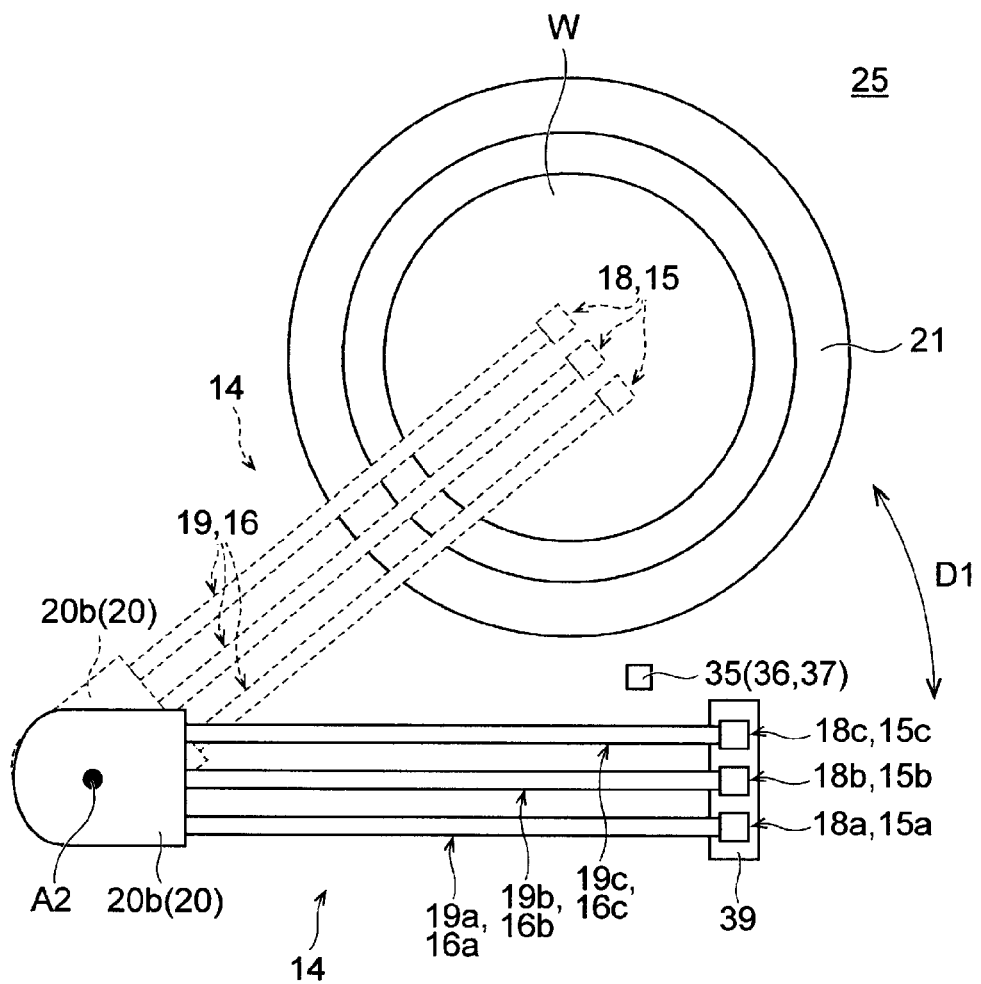
FIG. 3 is a plan view illustrating a state of a portion inside a processing chamber.

FIG. 3 is a plan view illustrating a state of a portion inside the processing chamber 25.

In the present embodiment, a plurality of rocking arms 19 are provided, and a plurality of discharge heads 18 are also provided. In the example shown with reference to the figure, three rocking arms 19a, 19b, and 19c and three discharge heads 18a, 18b, and 18c are provided, and all of the rocking arms 19a, 19b, and 19c are attached to a single swiveling body portion 20b (the rocking device 20). A plurality of supply lines 16 (liquid pipes) are also provided. In the example shown with reference to the figure, three supply lines 16a, 16b, and 16c are provided to be connected to the corresponding discharge nozzles 15a, 15b, and 15c though the corresponding rocking arms 19a, 19b, and 19c and the corresponding discharge heads 18a, 18b, and 18c, respectively.

When the plurality of rocking arms 19 are not distinguished from each another, they are simply expressed as the "rocking arms 19", and when they are distinguished from each another, they are expressed with "a," "b," and "c" added to the end of reference numeral "19." The plurality of discharge nozzles 15, the plurality of supply lines 16, and the plurality of discharge heads 18 are also expressed in the same manner as the plurality of rocking arms 19.

The discharge nozzle 15, the supply line 16, the discharge head 18, and the rocking arm 19 move integrally in a swiveling direction D1 around the swiveling axial line A2 according to the swiveling operation of the rocking device 20. In FIG. 3, a state in which the discharge nozzle 15, the supply line 16, the discharge head 18, and the rocking arm 19 are arranged at a position (home position) retracted from above the substrate W is indicated by a solid line. Each discharge nozzle 15 arranged in the home position is arranged so as to face a liquid receiver 39 fixedly provided in the processing chamber 25. Further, in FIG. 3, an example of a state in which the discharge nozzle 15, the supply line 16, the discharge head 18, and the rocking arm 19 are arranged above the substrate W is indicated by a dotted line.

A liquid detection sensor 35 that detects the presence or absence of the processing liquid in each supply line 16 is provided inside the processing chamber 25. The liquid detection sensor 35 of the present embodiment is fixedly provided, so that a wiring connected to the liquid detection sensor 35 is unlikely to be disconnected. Each supply line 16 (particularly, a portion formed on the rocking arm 19 and the discharge head 18) is provided so as to be movable relative to the liquid detection sensor 35. In particular, each rocking arm 19 and a portion of the supply line 16 located on each rocking arm 19 cross a first measurement point of the liquid detection sensor 35. In this embodiment, the rocking device 20 is swiveled so that the plurality of rocking arms 19a, 19b, and 19c continuously pass through the first measurement point. During the swiveling operation, the liquid detection sensor 35 continuously detects whether or not the processing liquid is filled in a portion of the supply lines 16a, 16b, and 16c that passes through the first measurement point (that is, the first pipe measurement site to be described later (see reference numeral "R1" in FIG. 4)). In this way, according to the present embodiment, it is possible to easily and quickly detect the presence or absence of the processing liquid for the plurality of supply lines 16 by a single round of swiveling operation.

Figure 4:
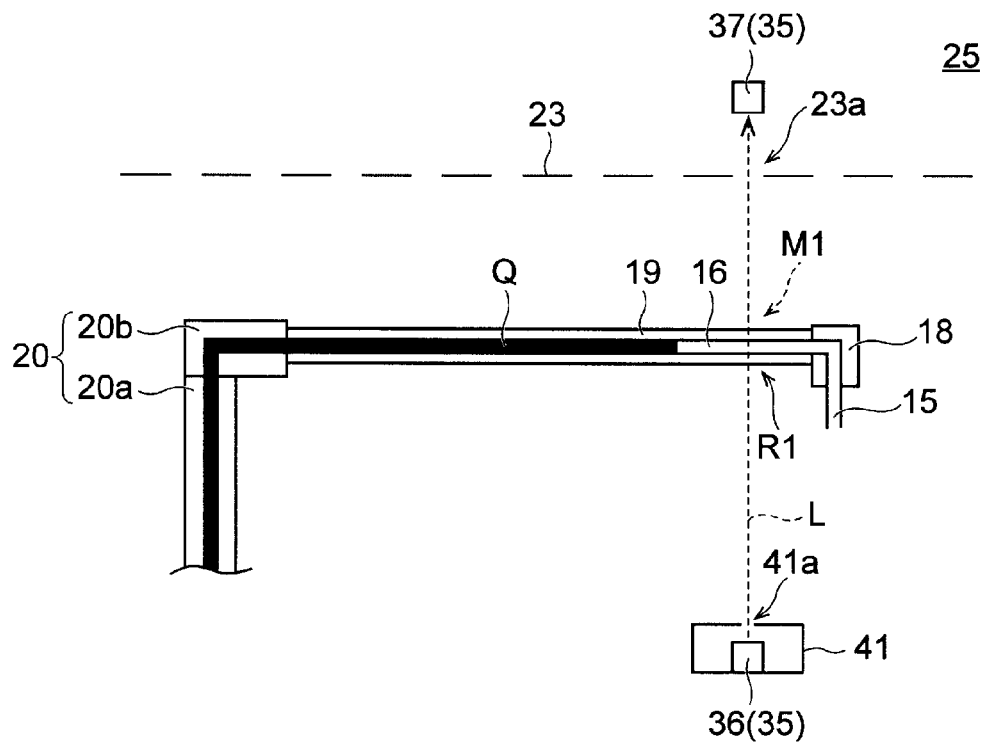
FIG. 4 is a schematic view illustrating a first pipe measurement site of a supply line and a first measurement point of a liquid detection sensor.

FIG. 4 is a schematic view illustrating the first pipe measurement site R1 of the supply line 16 and the first measurement point M1 of the liquid detection sensor 35.

The liquid detection sensor 35 of the present embodiment includes a light emitting part 36 and a light receiving part 37 that are fixedly provided inside the processing chamber 25. The light emitting part 36 is provided so as to be able to emit detection light L toward the light receiving part 37, and the light receiving part 37 is provided so as to be able to receive the detection light L. In the present embodiment, the presence or absence of the processing liquid Q in the first pipe measurement site R1 of the supply line 16 is detected based on the reception amount of the detection light L measured by the light receiving part 37.

In the example shown with reference to the figure, the light emitting part 36 is provided directly below the light receiving part 37, and the detection light L emitted from the light emitting part 36 travels upward in the direction opposite to the vertical direction on which gravity acts. The light emitting part 36 is covered with a detection cover 41, and the detection light L emitted from the light emitting part 36 passes through a through-hole 41a formed in the detection cover 41. The light receiving part 37 is located above the rectifying plate 23, and the detection light L traveling toward the light receiving part 37 passes through a through-hole 23a formed in the rectifying plate 23. In this way, the light emitting part 36 and the light receiving part 37 are covered with the detection cover 41 and the rectifying plate 23, respectively, to prevent adhesion of the processing liquid and the like. The interior of the detection cover 41 may be maintained at a positive pressure by blowing a gas (for example, an inert gas) by a gas ejection device (not shown). In this case, it is possible to effectively suppress droplets from infiltrating into the detection cover 41, thereby more reliably preventing the processing liquid and the like from adhering to the light emitting part 36.

Each supply line 16 (particularly, the first pipe measurement site R1) is provided to be movable relative to the liquid detection sensor 35 so as to cross an optical path (particularly the first measurement point M1) of the detection light L traveling from the liquid detection sensor 35 toward the light emitting part 36 in response to the swiveling of the rocking device 20. The liquid detection sensor 35 detects the presence or absence of the processing liquid Q in the first pipe measurement site R1 of each supply line 16 when the first pipe measurement site R1 of each supply line 16 passes through the first measurement point M1.

In the present embodiment, each rocking arm 19 and each supply line 16 (particularly a portion corresponding to the first pipe measurement site R1) are made of a material (for example, PFA (perfluoroalkoxyalkane)) through which the detection light L can transmit. The detection light L can transmit through the portion of each supply line 16 (including the first pipe measurement site R1) formed on each rocking arm 19. However, due to the influence of light scattering or the like, an amount of the detection light L received by the light receiving part 37 changes depending on whether or not the detection light L passes through each rocking arm 19 and each supply line 16, and depending on whether or not the processing liquid Q is present in a portion of the supply line 16 through which the detection light L passes.

For example, the amount of the detection light L received by the light receiving part 37 is larger in a case where the detection light L reaches the light receiving part 37 without passing through each supply line 16 and each rocking arm 19 than a case where the detection light L passes through each supply line 16 and each rocking arm 19. Further, the amount of the detection light L received by the light receiving part 37 is larger in a case where the measurement target site (that is, the first pipe measurement site R1) of the supply line 16 is filled with the processing liquid Q than a case where the first pipe measurement site R1 is not filled with the processing liquid Q. Therefore, the presence or absence of the processing liquid Q in the first pipe measurement site R1 of each supply line 16 can be detected based on comparison between the magnitude of the amount of the detection light L received by the light receiving part 37 and a threshold value set for each supply line 16.

In particular, in the present embodiment, as shown in FIG. 4, the valve mechanism (that is, the supply opening/closing valve 26 and the drain opening/closing valve 27 shown in FIG. 2) is operated so that the processing liquid Q in each supply line 16 is located at the upstream of the first pipe measurement site R1 of each supply line 16. In this state, the liquid detection sensor 35 can detect whether or not a defect such as leak of the processing liquid Q has occurred in the valve mechanism by detecting the presence or absence of the processing liquid Q in the first pipe measurement site R1 of each supply line 16 located at the first measurement point M1.

For example, when no defect has occurred in the valve mechanism, the processing liquid Q of each supply line 16 is appropriately arranged at a position of the upstream of the first pipe measurement site R1 according to the operation of the valve mechanism. Therefore, the detection light L passes through the first pipe measurement site R1 not filled with the processing liquid Q, and consequently, the amount of the detection light L received by the light receiving part 37 becomes relatively small. On the other hand, when the processing liquid Q leaks in the supply opening/closing valve 26, even if the drain opening/closing valve 27 operates properly, the processing liquid Q in each supply line 16 is not arranged at an appropriate position, so that the first pipe measurement site R1 may be in a state of being filled with the processing liquid Q. In this case, the detection light L passes through the first pipe measurement site R1 filled with the processing liquid Q, and as a result, the amount of the detection light L received by the light receiving part 37 grows relatively high. In this way, since the amount of the detection light L received by the light receiving part 37 changes depending on the presence or absence of the defect such as leak in the valve mechanism, the occurrence of defects can be detected by comparing the amount of light with the threshold value.

The threshold value is set to a value which is larger than the reception amount of the detection light L measured by the light receiving part 37 when the first pipe measurement site R1 is filled with the processing liquid Q, and is smaller than the reception amount of the detection light L measured by the light receiving part 37 when the first pipe measurement site R1 is not filled with the processing liquid Q. In this case, by comparing the amount of the detection light L actually received by the light receiving part 37 with the threshold value, it is possible to detect whether or not the first pipe measurement site R1 is filled with the processing liquid Q.

Further, when the plurality of supply lines 16 are provided as in the present embodiment, a unique threshold value may be set for each supply line 16. The amount of the detection light L received by the light receiving part 37 is not necessarily the same between the supply lines 16 depending on the material of each supply line 16 and each rocking arm 19, the composition of the processing liquid flowing through each supply line 16, or the individual difference of each supply line 16 and each rocking arm 19. For example, when the processing liquid Q is a chemical liquid used for BEOL (Back End of Line), the processing liquid Q often has a high coloring concentration. Therefore, by setting the threshold value for each supply line 16, it is possible to accurately detect whether or not the processing liquid Q is filled in the first pipe measurement site R1 of each supply line 16.

Figure 5:
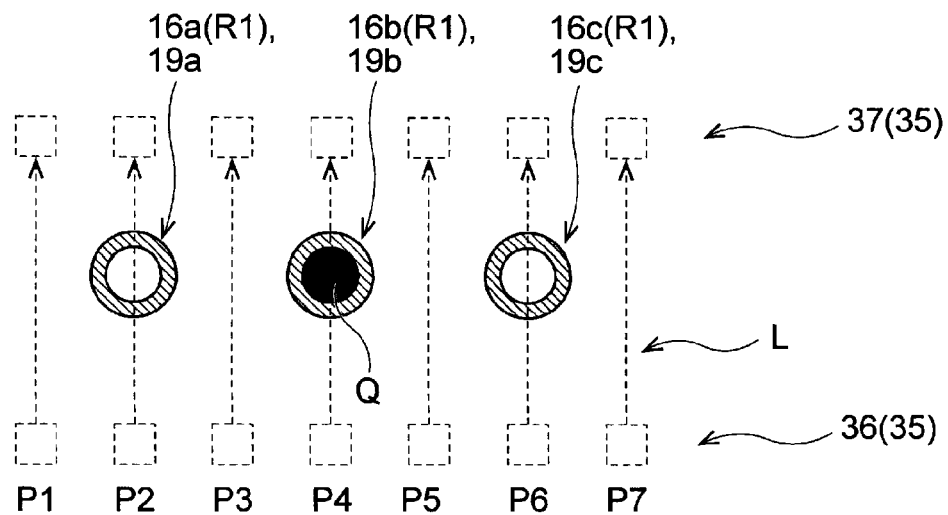
FIG. 5 is a view schematically illustrating relative positions between the liquid detection sensor, and the supply line and a rocking arm.

FIG. 5 is a view schematically illustrating relative positions (first relative position P1 to seventh relative position P7) between the liquid detection sensor 35, and the supply lines 16a, 16b, and 16c, and the rocking arms 19a, 19b, and 19c. In FIG. 5, the first supply line 16a to the third supply line 16c and the first rocking arm 19a to the third rocking arm 19c are shown in cross section at the first pipe measurement site R1. As is clear from FIG. 5, the first pipe measurement site R1 of the first supply line 16a and the third supply line 16c is not filled with the processing liquid Q, but the first pipe measurement site R1 of the second supply line 16b is filled with the processing liquid Q.

Figure 6:
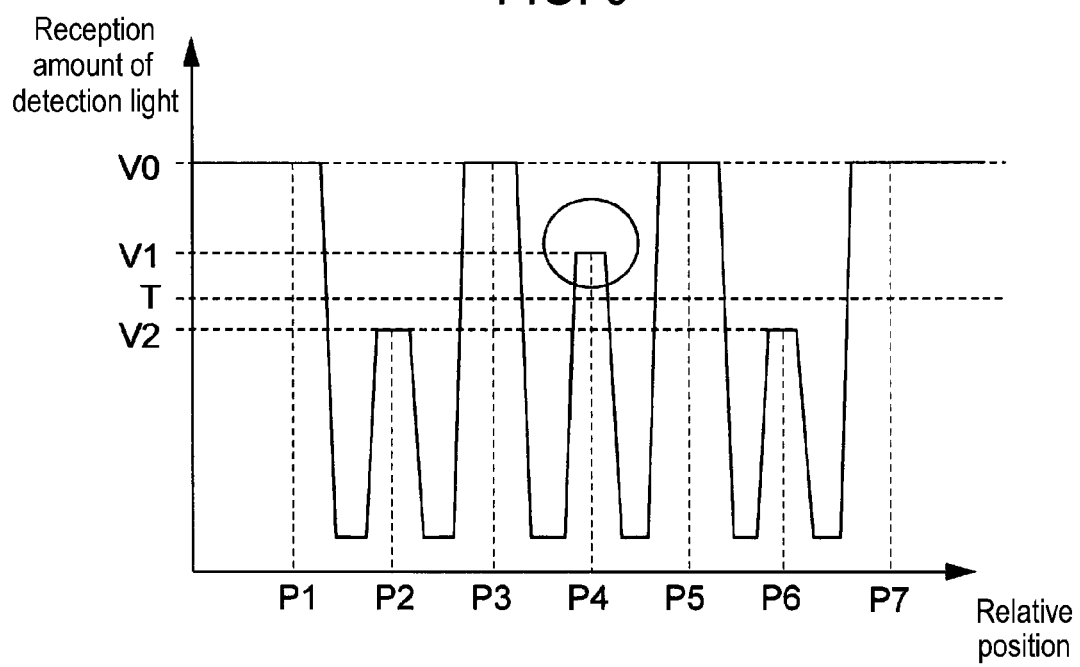
FIG. 6 is a graph showing an example of a relationship between the relative positions (horizontal axis) between the liquid detection sensor, and the supply line and the rocking arm and a reception amount (vertical axis) of detection light measured by a light receiving part.

FIG. 6 is a graph showing an example of a relationship between relative positions (horizontal axis) between the liquid detection sensor 35, and the supply line 16 and the rocking arm 19, and the reception amount (vertical axis) of the detection light L measured by the light receiving part 37. The graph shown in FIG. 6 shows an example of a relationship obtained when the first supply line 16a to the third supply line 16c and the liquid detection sensor 35 in the state shown in FIG. 5 are moved relative to each other.

When the supply line 16, the rocking arm 19, and the liquid detection sensor 35 are arranged at relative positions at which the detection light L does not pass through each supply line 16 and each rocking arm 19, the detection light L received by the light receiving part 37 indicates the maximum reception amount V0 (see P1, P3, P5, and P7 in FIGS. 5 and 6). On the other hand, when the supply line 16, the rocking arm 19, and the liquid detection sensor 35 are arranged at relative positions at which the detection light L passes through each supply line 16 and each rocking arm 19, the detection light L received by the light receiving part 37 indicates a reception amount smaller than the maximum reception amount V0. In particular, when the detection light L passes through an empty first pipe measurement site R1 (the first supply line 16a and the third supply line 16c) not filled with the processing liquid Q, the detection light L received by the light receiving part 37 indicates a relatively small reception amount V2 (see P2 and P6 in FIGS. 5 and 6). On the other hand, when the detection light L passes through the first pipe measurement site R1 (the second supply line 16b) filled with the processing liquid Q, the detection light L received by the light receiving part 37 indicates a relatively large reception amount V1 (V1>V2) (see P4 in FIGS. 5 and 6).

Therefore, by setting the threshold value T to a value smaller than the reception amount V1 and larger than the reception amount V2, it is possible to detected, with high accuracy, whether or not the first pipe measurement site R1 of each of the first supply line 16a to the third supply line 16c is filled with the processing liquid Q. Further, it is possible to grasp the "relative positions between the liquid detection sensor 35, and the supply line 16 and the rocking arm 19" from control data indicating the swiveling position, the swiveling distance, and/or the swiveling time of the rocking device 20. Therefore, detection with high accuracy can be performed by comparing the reception amount of the detection light L measured by the light receiving part 37 at the predetermined "relative positions between the liquid detection sensor 35, and the supply line 16 and the rocking arm 19 (the first relative position P1 to the seventh relative position P7)" with the threshold value T.

The processing unit 10 may further include other devices (not described above). For example, an exhaust device for discharging a gas from the interior of the processing chamber 25 and a drain device for discharging a liquid dropped (scattered) from the substrate W, from the interior of the processing chamber 25, may be provided. Further, a heating device for heating a liquid on the substrate W to promote the liquid processing of the substrate W may be provided.

Figure 7:
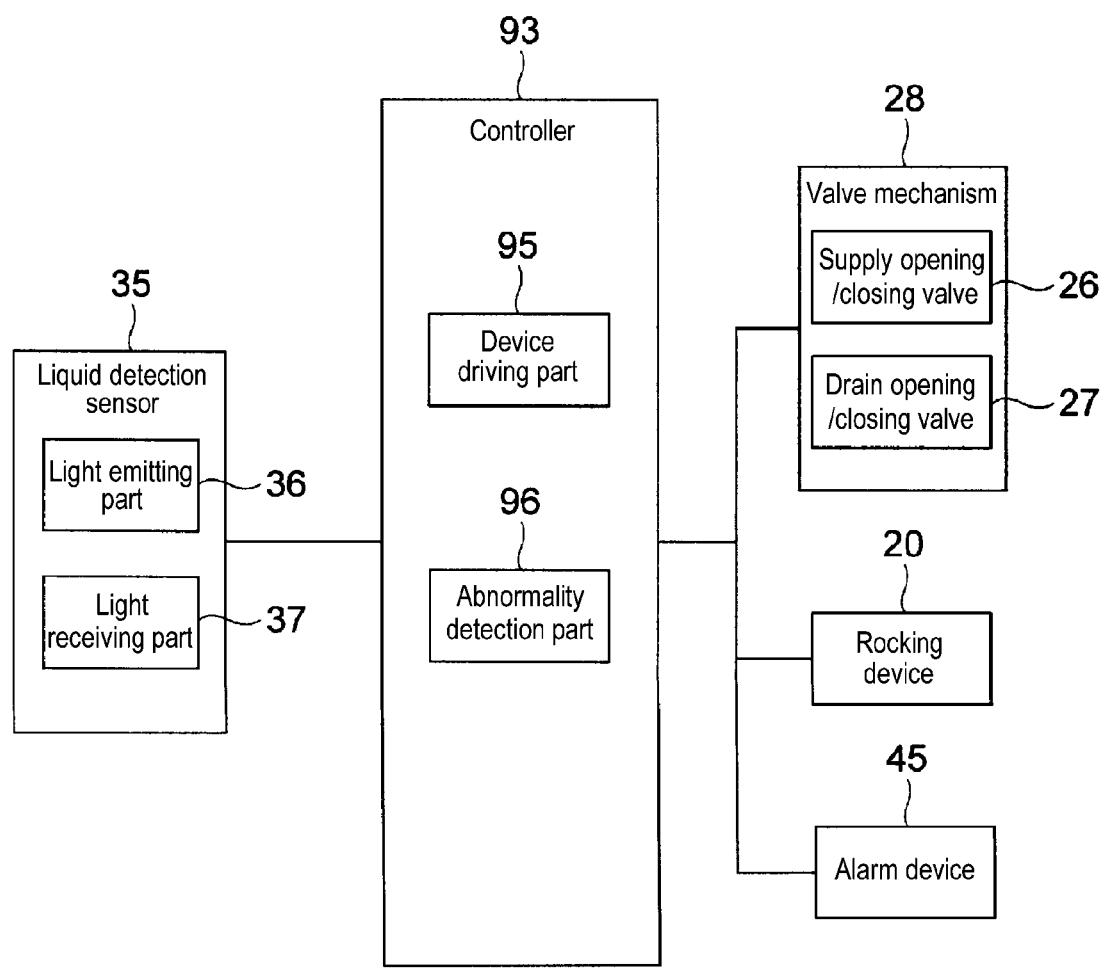
FIG. 7 is a block diagram showing an example of a functional configuration of a controller.

FIG. 7 is a block diagram showing an example of a functional configuration of the controller 93. In particular, FIG. 7 schematically shows an example of the functional configuration in which whether or not a defect such as leak of the processing liquid Q has occurred is detected based on a measurement result of the liquid detection sensor 35.

The controller 93 includes a device drive part 95 and an abnormality detection part 96. The device drive part 95 controls the driving of various devices connected to the controller 93. The abnormality detection part 96 detects the presence or absence of a defect such as leak based on the measurement result of the liquid detection sensor 35.

The liquid detection sensor 35 (the light emitting part 36 and the light receiving part 37), the valve mechanism 28 (the supply opening/closing valve 26 and the drain opening/closing valve 27), the rocking device 20, and an alarm device 45 are connected to the controller 93. The driving of the liquid detection sensor 35, the valve mechanism 28, the rocking device 20, and the alarm device 45 is controlled by the device drive part 95.

The liquid detection sensor 35 transmits the measurement result to the controller 93. In the present embodiment, data indicating the reception amount of the detection light L actually measured by the light receiving part 37 are transmitted to the controller 93 (particularly the abnormality detection part 96). The abnormality detection part 96 compares the reception amount of the detection light L sent from the light receiving part 37 with the threshold value T to determine whether or not the first pipe measurement site R1 of each supply line 16 is filled with the processing liquid Q. The abnormality detection part 96 of the present embodiment acquires information on the predetermined "relative positions between the liquid detection sensor 35, and the supply line 16 and the rocking arm 19 (see the first relative position P1 to the seventh relative position P7 in FIG. 5 and FIG. 6)" based on drive information of the rocking device 20. Then, the abnormality detection part 96 compares the reception amount of the detection light L measured by the light receiving part 37 at the predetermined "relative positions between the liquid detection sensor 35, and the supply line 16 and the rocking arm 19" with the threshold value T.

In a state in which the valve mechanism 28 is operating so that the processing liquid is located at the upstream of the first pipe measurement site R1, when the liquid detection sensor 35 indicates that the first pipe measurement site R1 is not filled with the processing liquid Q, the abnormality detection part 96 determines that no abnormality such as leak has occurred in the valve mechanism 28. In the state in which the valve mechanism 28 is operating so that the processing liquid is located at the upstream of the first pipe measurement site R1, when the liquid detection sensor 35 indicates that the first pipe measurement site R1 is filled with the processing liquid Q, the abnormality detection part 96 determines that an abnormality such as leak has occurred in the valve mechanism 28.

When determining that an abnormality such as a leak has occurred in the valve mechanism 28, the abnormality detection part 96 controls driving of the alarm device 45 to issue an alarm to notify a user of the occurrence of the abnormality. The form of the alarm issued from the alarm device 45 is not particularly limited, but the alarm is typically issued by voice or display. When determining that an abnormality such as a leak has not occurred in the valve mechanism 28, the abnormality detection part 96 may notify the user through the alarm device 45 that no abnormality has occurred.

Next, an example of a substrate liquid processing method (including a leak check method) will be described. Each method to be described below is performed by appropriately driving each device constituting the substrate liquid processing apparatus under the control of the controller 93.

Figure 8:
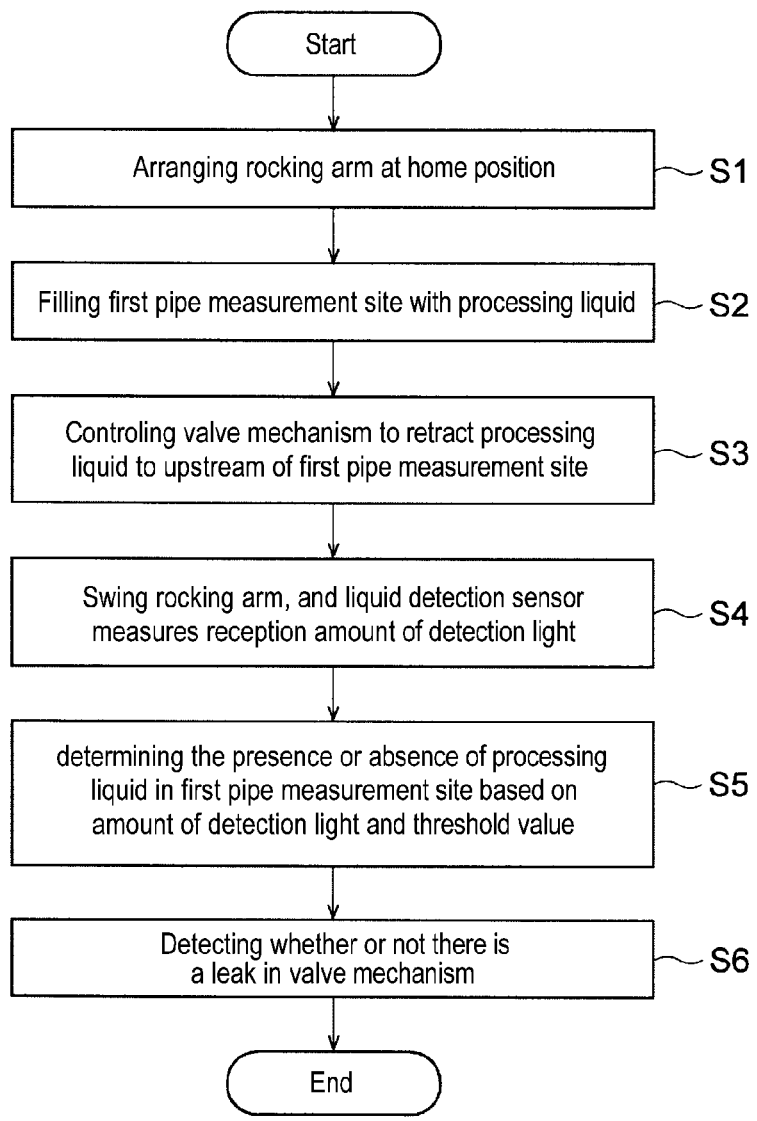
FIG. 8 is a flowchart showing an example of leak check flow.

FIG. 8 is a flowchart showing an example of a leak check flow.

First, the controller 93 controls the rocking device 20 to arrange each rocking arm 19 at the home position (see the solid line portion in FIG. 3) (S1 in FIG. 8).

Then, the controller 93 controls the valve mechanism 28 to fill the first pipe measurement site R1 of each supply line 16 with the processing liquid Q (S2). Specifically, the supply opening/closing valve 26 is opened and the drain opening/closing valve 27 is closed to flow the processing liquid Q from the processing liquid source 31 toward the discharge nozzle 15 while preventing the processing liquid Q from flowing from the supply line 16 into the drain line 17. Then, at a timing when the first pipe measurement site R1 of each supply line 16 is filled with the processing liquid Q, the supply opening/closing valve 26 is closed while the drain opening/closing valve 27 keeps closed. In this step S2, from the viewpoint of reliably filling the first pipe measurement site R1 of each supply line 16 with the processing liquid Q, it is preferable to discharge the processing liquid Q from each discharge nozzle 15. The processing liquid discharged from each discharge nozzle 15 arranged at the home position lands on and is collected in the liquid receiver 39 (see FIG. 3).

Then, the controller 93 controls the valve mechanism 28 to retract the processing liquid Q to a position of the upstream of the first pipe measurement site R1 of each supply line 16 so that the first pipe measurement site R1 is not filled with the processing liquid Q (S3). Specifically, the supply opening/closing valve 26 is closed and the drain opening/closing valve 27 is opened to flow the processing liquid Q from the supply line 16 into the drain line 17. Then, at a timing when it is considered that the processing liquid Q of each supply line 16 has retracted to the upstream of the first pipe measurement site R1, the drain opening/closing valve 27 is closed while the supply opening/closing valve 26 keeps closed. At this time, a timing at which the drain opening/closing valve 27 is closed can be determined based on an elapsed time after a timing at which the drain opening/closing valve 27 is opened. In this way, the flow of the processing liquid Q in the supply line 16 is adjusted by the valve mechanism 28 so that the processing liquid Q in the supply line 16 connected to the discharge nozzle 15 is located at the upstream of the first pipe measurement site R1 of the supply line 16.

Then, the controller 93 controls the rocking device 20 to swing each rocking arm 19 so that the first pipe measurement site R1 of each supply line 16 passes through the first measurement point M1, and the light receiving part 37 of the liquid detection sensor 35 measures the reception amount of the detection light L (S4). The measurement result of the light receiving part 37 is sent to the controller 93 (particularly the abnormality detection part 96). In this step S4, the supply opening/closing valve 26 and the drain opening/closing valve 27 keep closed.

Then, the abnormality detection part 96 determines the presence or absence of the processing liquid Q in the first pipe measurement site R1 of each supply line 16 based on the reception amount of the detection light L sent from the light receiving part 37 and the threshold value T (S5). In the present embodiment, "whether or not the first pipe measurement site R1 is filled with the processing liquid Q" corresponds to the "presence or absence of the processing liquid Q in the first pipe measurement site R1." In this way, the presence or absence of the processing liquid Q in the first pipe measurement site R1 located at the first measurement point M1 is detected by the liquid detection sensor 35.

Then, the abnormality detection part 96 determines whether or not there is leak in the valve mechanism 28 (particularly the supply opening/closing valve 26), based on whether or not the first pipe measurement site R1 of each supply line 16 is filled with the processing liquid Q (S6). When determining that there is leak in the valve mechanism 28, the abnormality detection part 96 generates an alarm from the alarm device 45 (see FIG. 7).

Next, an example of a method of determining the threshold value T will be described. The determination of the threshold value T is performed prior to the execution of the leak check flow (see FIG. 8), and a determined threshold value T is used in the leak check flow.

Figure 9:
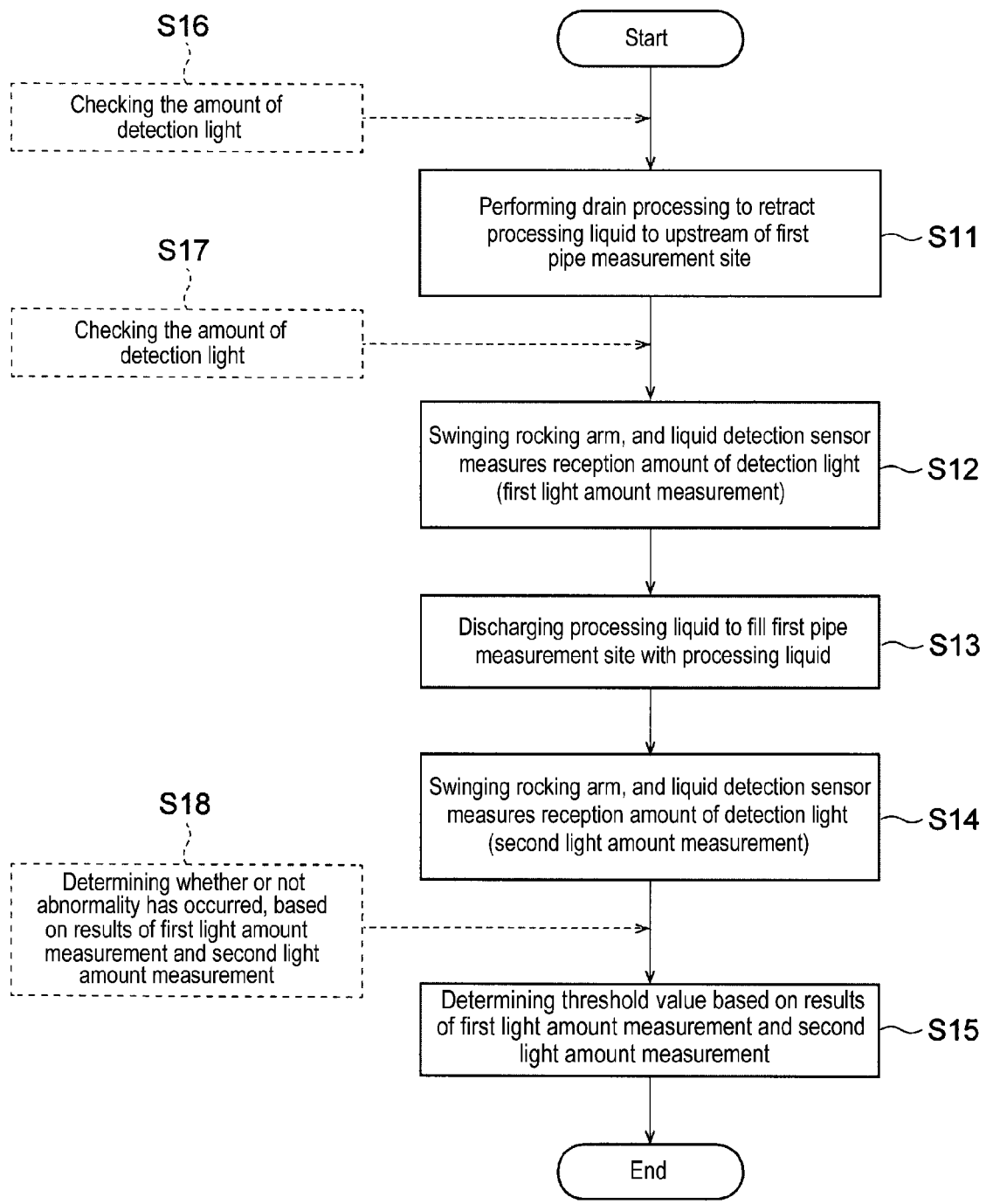
FIG. 9 is a flowchart showing an example of a threshold value determination flow.

FIG. 9 is a flowchart showing an example of a determination flow of the threshold value T.

First, the controller 93 controls the valve mechanism 28 to discharge the processing liquid Q from each supply line 16 to retract the processing liquid Q to the upstream of the first pipe measurement site R1 (S11 in FIG. 9). Specifically, the supply opening/closing valve 26 is closed and the drain opening/closing valve 27 is opened to flow the processing liquid Q from each supply line 16 into the drain line 17.

Then, the controller 93 controls the rocking device 20 to swing each rocking arm 19 so that the first pipe measurement site R1 of each supply line 16 passes through the first measurement point M1, and the light receiving part 37 of the liquid detection sensor 35 measures the reception amount of the detection light L (S12: first light amount measurement). The measurement result of the light receiving part 37 is sent to the controller 93 (particularly the abnormality detection part 96). In this step S12, the supply opening/closing valve 26 keeps closed, but the drain opening/closing valve 27 may be closed or opened.

Then, the controller 93 controls the valve mechanism 28 to discharge the processing liquid Q supplied via each supply line 16, from each discharge nozzle 15, to fill the first pipe measurement site R1 of each supply line 16 with the processing liquid Q (S13). Specifically, at a state in which each supply line 16 is located at the home position, the supply opening/closing valve 26 is opened and the drain opening/closing valve 27 is closed. As a result, the processing liquid Q is flowed from the processing liquid source 31 toward each discharge nozzle 15 while preventing the processing liquid Q from flowing from each supply line 16 into the drain line 17. The processing liquid Q discharged from each discharge nozzle 15 is collected by the liquid receiver 39. Then, at the timing when the first pipe measurement site R1 of each supply line 16 is filled with the processing liquid Q, the supply opening/closing valve 26 is closed while the drain opening/closing valve 27 keeps closed.

Then, the controller 93 controls the rocking device 20 to swing each rocking arm 19 so that the first pipe measurement site R1 of each supply line 16 passes through the first measurement point M1, and the light receiving part 37 of the liquid detection sensor 35 measures the reception amount of the detection light L (S14: second light amount measurement). The measurement result of the light receiving part 37 is sent to the controller 93 (particularly the abnormality detection part 96). In this step S14, the supply opening/closing valve 26 and the drain opening/closing valve 27 keep closed, and the first pipe measurement site R1 of each supply line 16 keeps filled with the processing liquid Q.

Then, the abnormality detection part 96 determines the threshold value T based on the results of the first light amount measurement (S12) and the second light amount measurement (S14) (S15). A specific calculation method of the threshold value T is not particularly limited, but for example, a value of ½ of the sum of the "reception amount of the detection light L obtained by the first light amount measurement" and the "reception amount of the detection light L obtained by the second light amount measurement" may be set as the threshold value T. The abnormality detection part 96 may store the determined threshold value T in the storage part (not shown) of the controller 93 and may appropriately read and use the same from the storage part as necessary.

In the above-described determination flow of the threshold value T, a step of checking the presence or absence of an abnormality may be appropriately performed.

For example, the abnormality detection part 96 may check the amount of the detection light L emitted from the light emitting part 36 prior to the above-described step S11 (see S16 in FIG. 9). Specifically, in a state in which there is no obstacle such as the rocking arm 19 between the light emitting part 36 and the light receiving part 37 (for example, a state in which the rocking arm 19 is arranged at the home position), the detection light L is emitted from the light emitting part 36. At this time, the amount of the detection light L can be checked based on whether or not the amount of the detection light L actually received by the light receiving part 37 falls in an allowable range of the amount of the detection light L expected to be emitted from the light emitting part 36.

The checking the amount of the detection light L as above may be performed at other timings, for example, between the above-described steps S11 and S12 (see S17 in FIG. 9).

Further, the abnormality detection part 96 may check whether or not an abnormality has occurred, based on the results of the first light amount measurement (S12) and the second light amount measurement (S14) (see S18 in FIG. 9).

For example, the presence or absence of detection abnormality of the detection light L can be checked based on whether or not a difference between the "reception amount of the detection light L obtained by the first light amount measurement" and the "reception amount of the detection light L obtained by the second light amount measurement" is out of an assumed range. When the difference between the "reception amount of the detection light L obtained by the first light amount measurement" and the "reception amount of the detection light L obtained by the second light amount measurement" is too large or too smaller than an assumed value, it is considered that some abnormality has occurred in a measurement system of the detection light L.

When no abnormality is detected in such an abnormality check step (S16 to S18), the determination flow of the threshold value T (S11 to S15) may be continued. On the other hand, when an abnormality is detected in the abnormality check step, an abnormality recovery processing step is performed. In the abnormality recovery processing step, an arbitrary process for resolving an abnormal state may be performed. For example, the abnormality detection part 96 prompts the user through the alarm device 45 to readjust each device (for example, the liquid detection sensor 35) of the processing unit 10, or drives a cleaning device (not shown) to clean the liquid detection sensor 35. A specific method of cleaning the liquid detection sensor 35 is not particularly limited. For example, the cleaning device may spray a liquid such as water, or a gas onto the liquid detection sensor 35. After the abnormality recovery processing step is performed, the abnormality check step may be performed again, the determination flow of the threshold value T may be performed from the beginning, or a step to be performed after the abnormality check step in the determination flow of the threshold value T may be performed.

Next, an example of a substrate liquid processing method of supplying the processing liquid Q to the substrate W to perform the liquid processing while performing the leak check will be described.

Figure 10:
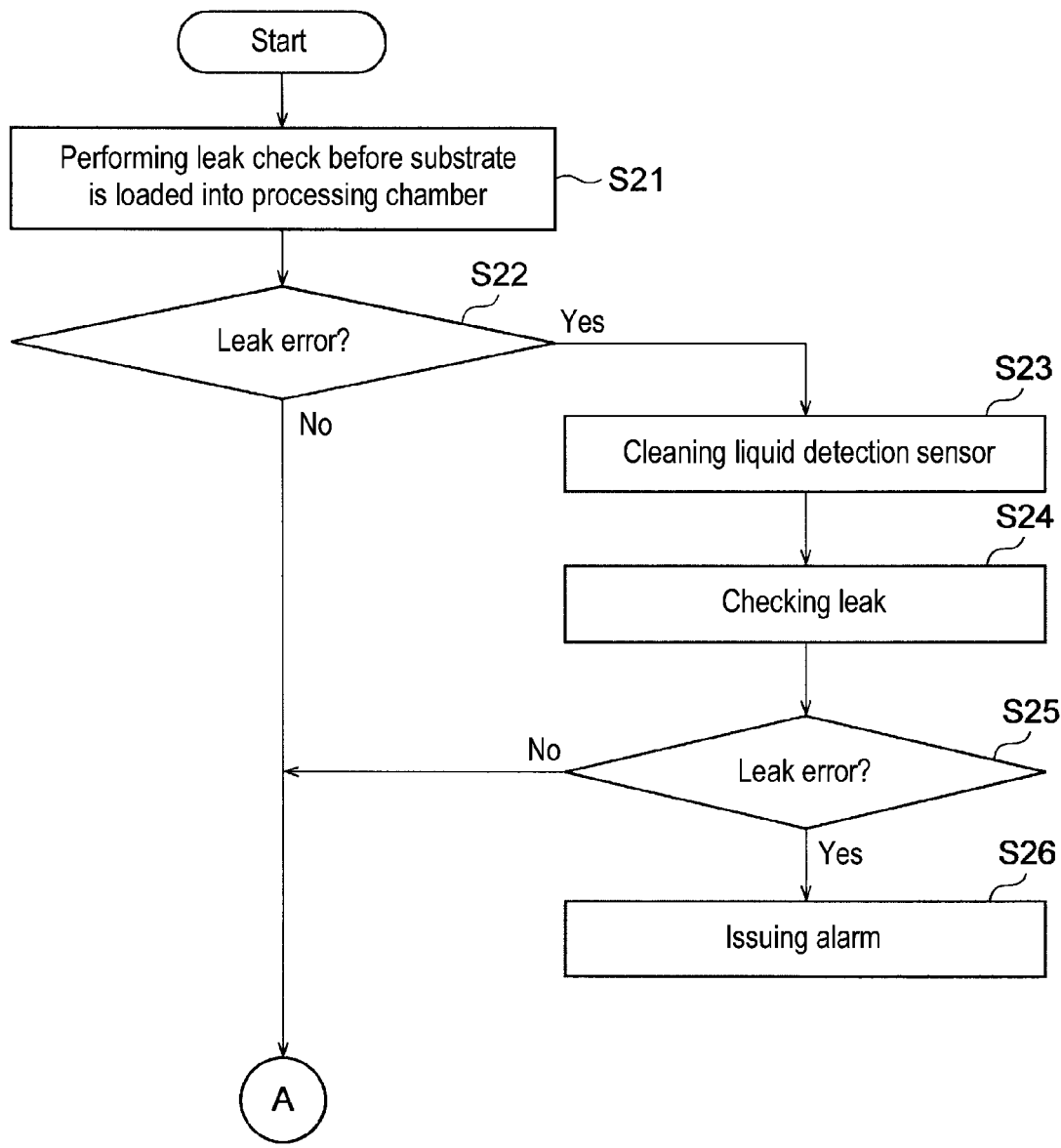
FIG. 10 is a flowchart showing an example of a substrate liquid processing flow.
Figure 11:
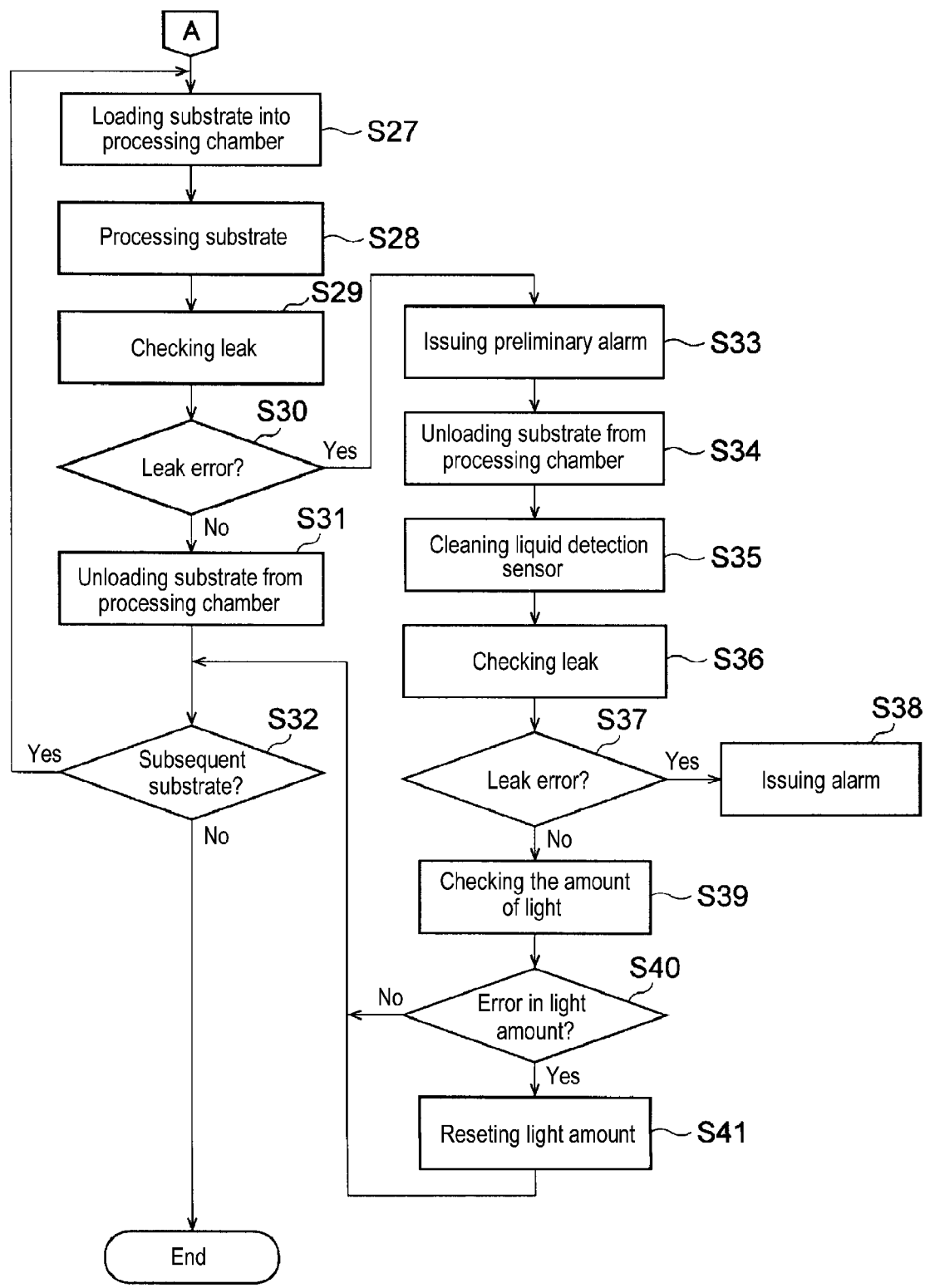
FIG. 11 is a flowchart showing an example of the substrate liquid processing flow.

FIGS. 10 and 11 are flowcharts showing an example of a substrate liquid processing flow. In particular, FIG. 10 shows an example of a processing flow before the substrate W is loaded into the processing chamber 25, and FIG. 11 shows an example of a processing flow after the substrate W is loaded into the processing chamber 25.

In the substrate liquid processing method shown in FIGS. 10 and 11, the leak check is performed before the substrate W is loaded into the processing chamber 25 (S21 in FIG. 10). The leak check can be performed according to, for example, the processing flow shown in FIG. 8, but may be performed according to other processing flows.

When the result of the leak check (see S6 in FIG. 8) indicates that "no leak has occurred in the valve mechanism 28" ("No" in S22), the substrate W is loaded into the processing chamber 25 (S27). On the other hand, when the result of the leak check indicates that "leak has occurred in the valve mechanism 28" ("Yes" in S22), a cleaning device (not shown) is driven under the control of the controller 93 to clean the liquid detection sensor 35 (the light emitting part 36 and/or the light receiving part 37) (S23). After that, the leak check is performed again (S25). When the result of the leak check indicates that "no leak has occurred in the valve mechanism 28" ("No" in S25), the substrate W is loaded into the processing chamber 25 (S27). On the other hand, when the result of the leak check indicates that "leak has occurred in the valve mechanism 28" ("Yes" in S25), the alarm device 45 is driven under the control of the controller 93 to issue the alarm to notify the user of the occurrence of the leak (S26).

After the substrate W is loaded into the processing chamber 25 in step S27, the substrate W is processed by the processing unit 10 (S28). The substrate processing performed in this step S28 may include the liquid processing using the processing liquid Q, and may further include other processing as necessary.

After that, the leak check is performed again (S29). When the result of the leak check indicates that "no leak has occurred in the valve mechanism 28" ("No" in S30), the processed substrate W is unloaded from the processing chamber 25 (S31), and the controller 93 checks whether or not there is a subsequent substrate W to be loaded into the processing chamber 25. When there is the subsequent substrate W to be loaded into the processing chamber 25 ("Yes" in S32), the subsequent substrate W is loaded into the processing chamber 25 (S27). When there is no subsequent substrate W to be loaded into the processing chamber 25 ("No" in S32), the process ends.

On the other hand, when the result of the leak check (S29) indicates that "leak has occurred in the valve mechanism 28" ("Yes" in S30), the alarm device 45 is driven under the control of the controller 93 to issue a preliminary alarm (S33). After that, the processed substrate W is unloaded from the processing chamber 25 (S34), the liquid detection sensor 35 is cleaned by the cleaning device (S35), and the leak check is performed again (S36). When the result of the leak check indicates that "leak has occurred in the valve mechanism 28" ("Yes" in S37), the alarm device 45 is driven under the control of the controller 93 to issue the alarm to notify the user of the occurrence of the leak (S38).

On the other hand, when the result of the leak check (S36) indicates that "no leak has occurred in the valve mechanism 28" ("No" in S37), a light amount check is performed (S39; see S16 and S17 in FIG. 9). When the result of the light amount check indicates that "there is no error in the light amount of the liquid detection sensor 35 (particularly the light emission amount of the light emitting part 36)" ("No" in S40), the controller 93 checks whether or not there is a subsequent substrate W to be loaded into the processing chamber 25. When there is the subsequent substrate W to be loaded into the processing chamber 25 ("Yes" in S32), the subsequent substrate W is loaded into the processing chamber 25 (S27). When there is no subsequent substrate W to be loaded into the processing chamber 25 ("No" in S32), the process ends.

On the other hand, when the result of the light amount check indicates that "there is an error in the light amount of the liquid detection sensor 35" ("Yes" in S40), the light amount of the liquid detection sensor 35 is reset under the control of the controller 93 (S41). As a result, even if a time-dependent decrease in the light emission amount of the light emitting part 36 is generated, an appropriate leak check can be continuously performed. After that, it is checked by the controller 93 whether or not there is a subsequent substrate W to be loaded into the processing chamber 25. When there is the subsequent substrate W ("Yes" in S32), the subsequent substrate W is loaded into the processing chamber 25 (S27), and when there is no subsequent substrate W ("No" in S32), the process ends.

As described above, according to the apparatus and method of the present embodiment described above, it is possible to accurately detect the occurrence of defects such as leak of the processing liquid Q in the valve mechanism 28.

If the occurrence of leak in the valve mechanism 28 cannot be properly detected, various problems will occur in the liquid processing of the substrate W performed by the processing unit 10. For example, if leak of the processing liquid Q generated in the supply opening/closing valve 26 is left unattended, the processing liquid Q may unintentionally drip from the discharge nozzle 15 onto the substrate W, or the concentration of a chemical liquid on the substrate W may unintentionally change, or the substrate W may be poorly dried. On the other hand, according to the apparatus and method of the present embodiment, it is possible to appropriately detect the occurrence of leak in the supply opening/closing valve 26 and take appropriate measures for eliminating the leak. As a result, it is possible to prevent problems such as unintentional dripping of the processing liquid Q in advance so that the liquid processing of the substrate W can be stably performed in the processing unit 10.

Further, the apparatus and method of the present embodiment can detect the occurrence of leak of a very small amount (for example, 10 ml/min or less) of processing liquid Q, providing the very high leak detection accuracy.

Further, according to the apparatus and method of the present embodiment, it is also possible to detect the presence or absence of malfunction of the valve mechanism 28 (particularly the drain opening/closing valve 27) and the presence or absence of unintended foaming of the processing liquid Q in the supply line 16. For example, if the drain opening/closing valve 27 does not operate properly in the drain processing, even when the controller 93 controls the drain opening/closing valve 27, the processing liquid in the supply line 16 may not be retracted to the upstream of the first pipe measurement site R1. Further, if the processing liquid Q is foamed in the first pipe measurement site R1 of the supply line 16, even when the controller 93 controls the drain opening/closing valve 27, the foamed portion of the processing liquid Q may not be retracted to the upstream of the first pipe measurement site R1. Even in these cases, the liquid detection sensor 35 can detect the presence of the processing liquid Q in the first pipe measurement site R1.

Further, according to the apparatus and method of the present embodiment, an abnormality related to each of the plurality of supply lines 16 can be detected by a single liquid detection sensor 35. As a result, the device configuration in the processing unit 10 can be simplified.

First Modification

The liquid detection sensor 35 may detect the presence or absence of the processing liquid Q in a second pipe measurement site of the supply line 16 (liquid pipe), which is different from the first pipe measurement site R1 and is located at a second measurement point different from the first measurement point M1.

Figure 12:
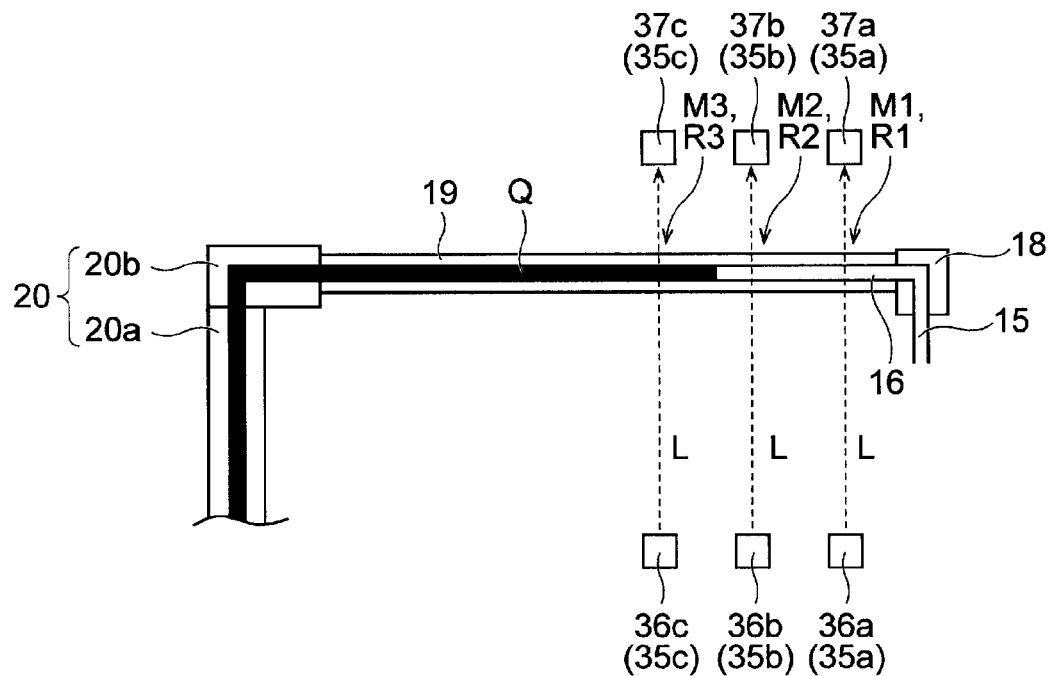
FIG. 12 is a view for explaining an abnormality detection method according to a first modification.
Figure 13:
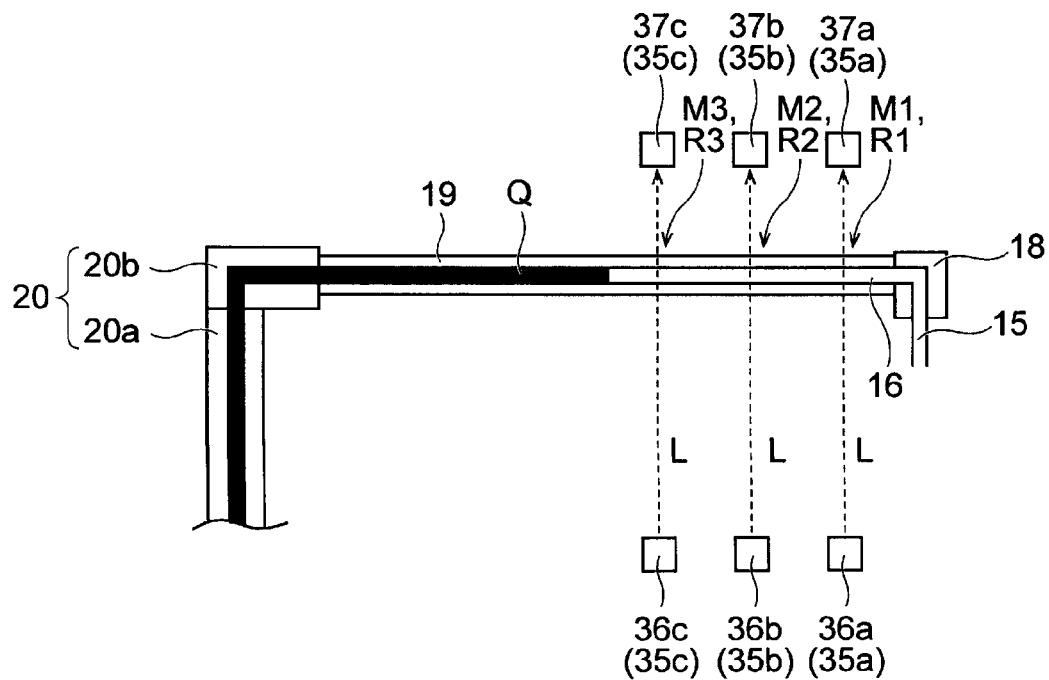
FIG. 13 is a view for explaining the abnormality detection method according to the first modification.
Figure 14:
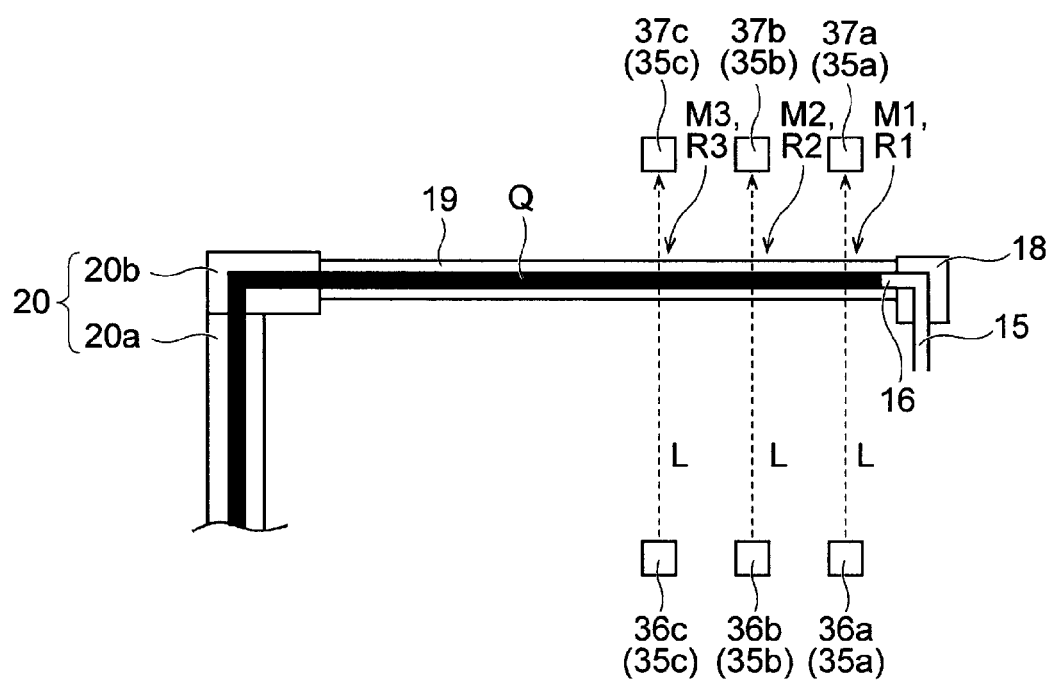
FIG. 14 is a diagram for explaining the abnormality detection method according to the first modification.

FIGS. 12 to 14 are views for explaining an abnormality detection method according to a first modification.

In the examples shown in FIGS. 12 to 14, a plurality of liquid detection sensors (specifically, first to third liquid detection sensors 35a, 35b, and 35c) are provided. These liquid detection sensors 35a, 35b, and 35c detect the presence or absence of the processing liquids Q in different portions (specifically, first to third pipe measurement sites R1, R2, and R3) of the supply lines 16. The first pipe measurement site R1, the second pipe measurement site R2, and the third pipe measurement site R3 are located in this order from the downstream side of the supply line 16 (particularly the portion located on the rocking arm 19) toward the upstream side thereof.

The first liquid detection sensor 35a includes a first light emitting part 36a and a first light receiving part 37a and detects the presence or absence of the processing liquid Q in the first pipe measurement site R1 located at a first measurement point M1. The second liquid detection sensor 35b includes a second light emitting part 36b and a second light receiving part 37b and detects the presence or absence of the processing liquid Q in the second pipe measurement site R2 located at a second measurement point M2. The third liquid detection sensor 35c includes a third light emitting part 36c and a third light receiving part 37c and detects the presence or absence of the processing liquid Q in the third pipe measurement site R3 located at a third measurement point M3.

For example, in a case shown in FIG. 12, the third light emitting part 36c detects that there is the processing liquid Q in the third pipe measurement site R3, but the first light emitting part 36a and the second light emitting part 36b detect that there is no processing liquid Q in the first pipe measurement site R1 and the second pipe measurement site R2. In a case shown in FIG. 13, the first light emitting part 36a to the third light emitting part 36c detect that there is no processing liquid Q in the first pipe measurement site R1 to the third pipe measurement site R3. In a case shown in FIG. 14, the first light emitting part 36a to the third light emitting part 36c detect that there is the processing liquid Q in the first pipe measurement site R1 to the third pipe measurement site R3.

The controller 93 (particularly the abnormality detection part 96) can finely specify the position of the processing liquid Q in the supply line 16 based on the detection results of the plurality of liquid detection sensors 35a, 35b, and 35c. In this way, the abnormality detection part 96 of this modification can detect the deviation of a pullback position of the processing liquid Q in the supply line 16 step by step. As a result, for example, the abnormality detection part 96 can detect the presence or absence of an abnormality such as leak of the processing liquid Q, and if the abnormality has occurred, can also detect the degree of the abnormality.

OTHER MODIFICATIONS

The liquid detection sensor 35 that detects the presence or absence of the processing liquid in the liquid pipe is not limited to the above-described optical sensors (that is, the light emitting part 36 and the light receiving part 37), but may adopt an arbitrary detection manner and an arbitrary configuration. For example, a sensor capable of detecting the position and filling amount of the processing liquid in the supply line 16 by measuring the capacitance or magnetic field in the supply line 16 (particularly a portion including the measurement target site) may be used as the liquid detection sensor 35.

The leak check may be performed at timings other than the above-mentioned timings in the substrate liquid processing method, and the number of leak checks is not particularly limited. The leak check may be performed at any timing before, after and/or during product processing.

Information on the "relative positions between the liquid detection sensor 35, and the supply line 16 and the rocking arm 19 (see the first relative position P1 to the seventh relative position P7 in FIGS. 5 and 6)" may be acquired based on a change in the reception amount of the detection light L measured by the light receiving part 37. For example, as shown in FIG. 6, the reception amount (the vertical axis in FIG. 6) of the detection light L measured by the light receiving part 37 indicates a certain degree of common change tendency (that is, a mountain-valley change tendency) according to the "relative positions between the liquid detection sensor 35, and the supply line 16 and the rocking arm 19." Therefore, the information on the "relative positions between the liquid detection sensor 35, and the supply line 16 and the rocking arm 19 (see the relative position P1 to the seventh relative position P7 in FIG. 5 and FIG. 6)" may be acquired based on a change tendency of the reception amount of the detection light L measured by the light receiving part 37. In this case, the detection accuracy of the leak check is not easily affected by a change in the light emission amount of the liquid detection sensor 35 (particularly the light emitting part 36) due to aging or external factors, or by a change in the reception amount of the liquid detection sensor 35 (particularly the light receiving part 37) due to the misalignment of devices).

The processing unit 10 may include only one liquid pipe (that is, one supply line 16 and one drain line 17) and one discharge nozzle 15.

In the above-described embodiment, the abnormality such as leak is checked for the liquid pipe for the processing liquid Q supplied to the front surface (that is, the upper surface) of the substrate W, but an abnormality related to a liquid pipe (not shown) for the processing liquid Q supplied to the rear surface (that is, the lower surface) of the substrate W may be checked in the same manner.

It should be noted that the embodiments disclosed in the present disclosure are merely exemplary in all respects and are not to be construed in a limited way. The above-described embodiments and modifications may be omitted, replaced and changed in various forms without departing from the appended claims and the gist thereof. For example, the above-described embodiments and modifications may be used in combination, or embodiments other than the above may be used in combination with the above-described embodiments or modifications.

Further, the technical categories that embody the above-described technical ideas are not limited. For example, the above-described substrate liquid processing apparatus may be applied to other apparatuses. Further, the above-described technical ideas may be embodied by a computer program for causing a computer to execute one or more procedures (steps) included in the above-described substrate liquid processing method (including the leak check method and the abnormality detection method). Furthermore, the above-described technical ideas may be embodied by a non-transitory computer-readable recording medium storing such a computer program.

According to the present disclosure in some embodiments, it is advantageous in detecting the occurrence of defects such as leak in a processing liquid.

What is claimed is:

1. A substrate liquid processing apparatus comprising:
at least one liquid pipe through which a processing liquid flows;
a discharge nozzle configured to discharge the processing liquid supplied via the at least one liquid pipe;
a valve mechanism configured to regulate a flow of the processing liquid in the at least one liquid pipe;
a liquid detection sensor configured to detect presence or absence of the processing liquid in the at least one liquid pipe; and
a controller programmed to execute:
regulating, by the valve mechanism, the flow of the processing liquid to fill a first pipe measurement site of the at least one liquid pipe with the processing liquid and then to retract the processing liquid to an upstream side of the first pipe measurement site in the at least one liquid pipe;
stopping the regulating the flow of the processing liquid when the processing liquid is located only upstream of the first pipe measurement site in the at least one liquid pipe; and
while the regulating the flow of the processing liquid is stopped, detecting, by the liquid detection sensor, the presence or absence of the processing liquid at the first pipe measurement site located at a first measurement point,
wherein the at least one liquid pipe includes a plurality of liquid pipes, and each of the plurality of liquid pipes is provided so as to be movable relative to the liquid detection sensor, and
wherein when the first pipe measurement site in each of the plurality of liquid pipes passes through the first measurement point, the liquid detection sensor detects the presence or absence of the processing liquid in the first pipe measurement site of each of the plurality of liquid pipes.

2. The substrate liquid processing apparatus of claim 1, wherein each of the plurality of liquid pipes includes a supply line including the first pipe measurement site, and a drain line connected to the supply line and provided at a position lower than the discharge nozzle,
wherein the valve mechanism includes a supply opening/closing valve that regulates a flow of the processing liquid in the supply line, and a drain opening/closing valve that regulates a flow of the processing liquid in the drain line, and
wherein when retracting the processing liquid to the upstream side of the first pipe measurement site, the drain opening/closing valve operates so as to flow the processing liquid from the supply line to the drain line.

3. The substrate liquid processing apparatus of claim 1, wherein the liquid detection sensor includes a light receiving part capable of receiving detection light, and a light emitting part that emits the detection light,
wherein each of the plurality of liquid pipes is provided to be movable relative to the liquid detection sensor so that each of the plurality of liquid pipes crosses an optical path of the detection light from the light emitting part to the light receiving part, and
wherein the presence or absence of the processing liquid at the first pipe measurement site is detected based on comparison between a magnitude of an amount of the detection light received by the light receiving part and a threshold value.

4. The substrate liquid processing apparatus of claim 1, wherein the liquid detection sensor includes a light receiving part capable of detecting detection light, and a light emitting part that emits the detection light,
wherein each of the plurality of liquid pipes is provided to be movable relative to the liquid detection sensor so that each of the plurality of liquid pipes crosses an optical path of the detection light from the light emitting part to the light receiving part, and
wherein the presence or absence of the processing liquid at the first pipe measurement site of each of the plurality of liquid pipes is detected based on comparison between a magnitude of an amount of the detection light received by the light receiving part and a threshold value set for each of the plurality of liquid pipes.

5. The substrate liquid processing apparatus of claim 4, wherein the liquid detection sensor detects the presence or absence of the processing liquid at a second pipe measurement site in each of the plurality of liquid pipes, which is different from the first pipe measurement site and is located at a second measurement point different from the first measurement point.

6. The substrate liquid processing apparatus of claim 1, wherein the liquid detection sensor detects the presence or absence of the processing liquid at a second pipe measurement site in each of the plurality of liquid pipes, which is different from the first pipe measurement site and is located at a second measurement point different from the first measurement point.

7. A substrate liquid processing apparatus comprising:
at least one liquid pipe through which a processing liquid flows;
a discharge nozzle configured to discharge the processing liquid supplied via the at least one liquid pipe;
a valve mechanism configured to regulate a flow of the processing liquid in the at least one liquid pipe;
a liquid detection sensor configured to detect presence or absence of the processing liquid in the at least one liquid pipe; and
a controller programmed to execute:
regulating, by the valve mechanism, the flow of the processing liquid to fill a first pipe measurement site of the at least one liquid pipe with the processing liquid and then to retract the processing liquid to an upstream side of the first pipe measurement site in the at least one liquid pipe;
stopping the regulating the flow of the processing liquid when the processing liquid is located only upstream of the first pipe measurement site in the at least one liquid pipe; and
while the regulating the flow of the processing liquid is stopped, detecting, by the liquid detection sensor, the presence or absence of the processing liquid at the first pipe measurement site located at a first measurement point,
wherein the at least one liquid pipe includes a supply line including the first pipe measurement site, and a drain line connected to the supply line and provided at a position lower than the discharge nozzle,
wherein the valve mechanism includes a supply opening/closing valve that regulates a flow of the processing liquid in the supply line, and a drain opening/closing valve that regulates a flow of the processing liquid in the drain line,
wherein when retracting the processing liquid to the upstream side of the first pipe measurement site, the drain opening/closing valve operates so as to flow the processing liquid from the supply line to the drain line,
wherein the liquid detection sensor includes a light receiving part capable of receiving detection light, and a light emitting part that emits the detection light,
wherein the at least one liquid pipe is provided to be movable relative to the liquid detection sensor so that the at least one liquid pipe crosses an optical path of the detection light from the light emitting part to the light receiving part, and
wherein the presence or absence of the processing liquid at the first pipe measurement site is detected based on comparison between a magnitude of an amount of the detection light received by the light receiving part and a threshold value.

8. The substrate liquid processing apparatus of claim 7, wherein the liquid detection sensor detects the presence or absence of the processing liquid at a second pipe measurement site in the at least one liquid pipe, which is different from the first pipe measurement site and is located at a second measurement point different from the first measurement point.

9. A substrate liquid processing method, the method comprising:
regulating, by a valve mechanism, a flow of a processing liquid in at least one liquid pipe so that the processing liquid in the at least one liquid pipe connected to a discharge nozzle is located only upstream of a first pipe measurement site of the at least one liquid pipe; and
detecting, by a liquid detection sensor, presence or absence of the processing liquid at the first pipe measurement site located at a first measurement point,
wherein the at least one liquid pipe includes a plurality of liquid pipes, and each of the plurality of liquid pipes is provided so as to be movable relative to the liquid detection sensor, and
wherein when the first pipe measurement site in each of the plurality of liquid pipes passes through the first measurement point, the liquid detection sensor detects the presence or absence of the processing liquid in the first pipe measurement site of each of the plurality of liquid pipes.

10. A substrate liquid processing method, the method comprising:
regulating, by a valve mechanism, a flow of a processing liquid in at least one liquid pipe so that the processing liquid in the at least one liquid pipe connected to a discharge nozzle is located only upstream of a first pipe measurement site of the at least one liquid pipe; and
detecting, by a liquid detection sensor, presence or absence of the processing liquid at the first pipe measurement site located at a first measurement point,
wherein the at least one liquid pipe includes a supply line including the first pipe measurement site, and a drain line connected to the supply line and provided at a position lower than the discharge nozzle,
wherein the valve mechanism includes a supply opening/closing valve that regulates a flow of the processing liquid in the supply line, and a drain opening/closing valve that regulates a flow of the processing liquid in the drain line,
wherein when retracting the processing liquid to the upstream side of the first pipe measurement site, the drain opening/closing valve operates so as to flow the processing liquid from the supply line to the drain line,
wherein the liquid detection sensor includes a light receiving part capable of receiving detection light, and a light emitting part that emits the detection light,
wherein the at least one liquid pipe is provided to be movable relative to the liquid detection sensor so that the at least one pipe crosses an optical path of the detection light from the light emitting part to the light receiving part, and
wherein the presence or absence of the processing liquid at the first pipe measurement site is detected based on comparison between a magnitude of an amount of the detection light received by the light receiving part and a threshold value.

* * * * *